(12) United States Patent
Kang et al.

(10) Patent No.: US 7,102,938 B2
(45) Date of Patent: Sep. 5, 2006

(54) INTERNAL VOLTAGE GENERATION CONTROL CIRCUIT AND INTERNAL VOLTAGE GENERATION CIRCUIT USING THE SAME

(75) Inventors: Sang Hee Kang, Kyoungki-Do (KR); Kyoung-Nam Kim, Gyungsangbuk-Do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/102,420

(22) Filed: Apr. 8, 2005

(65) Prior Publication Data

US 2006/0171214 A1 Aug. 3, 2006

(30) Foreign Application Priority Data

Feb. 3, 2005 (KR) ................ 10-2005-0010148

(51) Int. Cl.
*G11C 7/00* (2006.01)
(52) U.S. Cl. .................... 365/193; 365/189.05
(58) Field of Classification Search ......... 365/193, 365/189.05
See application file for complete search history.

(56) References Cited

U.S. PATENT DOCUMENTS

| 6,229,747 B1 | 5/2001 | Cho et al. | |
| 6,563,760 B1 | 5/2003 | Song | |
| 6,574,150 B1 | 6/2003 | Suyama et al. | |
| 6,970,395 B1 * | 11/2005 | Le et al. .................. | 365/233 |
| 7,038,971 B1 * | 5/2006 | Chung ...................... | 365/233 |
| 2003/0035335 A1 | 2/2003 | Kawaguchi et al. | |
| 2004/0165448 A1 * | 8/2004 | Mizugaki et al. ....... | 365/189.04 |
| 2005/0248995 A1 * | 11/2005 | Davis et al. .......... | 365/189.05 |
| 2006/0039203 A1 * | 2/2006 | Chu et al. ............ | 365/189.04 |
| 2006/0092718 A1 * | 5/2006 | Cioaca ................. | 365/189.05 |

FOREIGN PATENT DOCUMENTS

KR  2000-195257  7/2000

* cited by examiner

*Primary Examiner*—Michael Tran
(74) *Attorney, Agent, or Firm*—Marshall, Gerstein & Borun LLP (57) ABSTRACT

An internal voltage generation control circuit and an internal voltage generation circuit using the same are provided. The internal voltage generation control circuit comprises first to n-th latches and a logic unit. The first latch receives, as an input signal, a column active pulse signal generated after a read/write command is input, and latches state information of the column active pulse signal, received when a clock signal is enabled, during a predetermined time, and then outputs the latched information. A k-th latch (2≦k≦n) receives an output signal of a k–1-th latch, and latches state information of the output signal of the k–1-th latch, received when the clock signal is enabled, during a predetermined time, and then outputs the latched information. The logic unit performs a logical operation between the column active pulse signal and output signals of the n latches and outputs an internal voltage generation control signal.

16 Claims, 4 Drawing Sheets

INTERNAL VOLTAGE GENERATION CONTROL CIRCUIT AND INTERNAL VOLTAGE GENERATION CIRCUIT USING THE SAME

BACKGROUND OF THE INVENTION

1. Field of the Invention

The present invention relates to an internal voltage generation control circuit and an internal voltage generation circuit using the same, and more particularly to an internal voltage generation control circuit and an internal voltage generation circuit using the same, wherein, when a read or write command is input, the internal voltage generation control circuit outputs an internal voltage generation control signal during a suitable time, regardless of the frequency of an external clock signal.

2. Description of the Related Art

As the operating frequency of semiconductor memory devices such as DRAM has increased for high-speed operations, much attention has recently been given to reducing current consumption. The current consumption reduction is an essential requirement for designing semiconductor devices such as DRAM as the application of DRAM or the like has been extended to portable devices, without being limited to main memories of computers. A conventional circuit internal voltage generation circuit generates an internal voltage required for input and output operations after an active operation. Specifically, the conventional internal voltage generation circuit generates an internal voltage when a read or write command is input, and constantly supplies the internal voltage until a predetermined delay time expires after clock periods, corresponding to the sum of a latency and a burst length, elapse from the moment when the read or write command is input. However, since the delay time is fixed regardless of the operating clock frequency, the conventional internal voltage generation circuit has a problem in that, as the clock frequency increases, unnecessarily large current is supplied during the delay time, thereby increasing current consumption.

Figure 1:
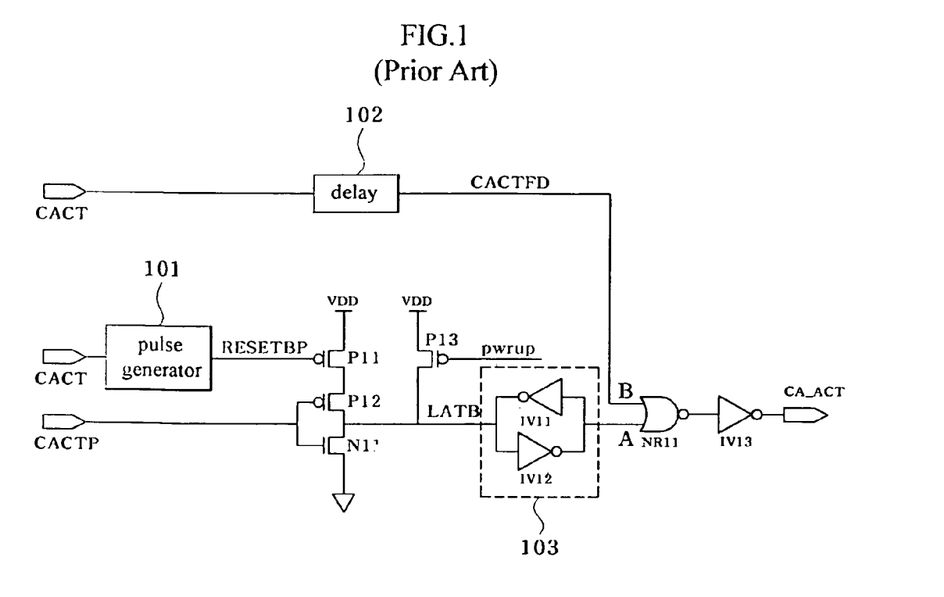
FIG. 1 illustrates the configuration of a conventional internal voltage generation control circuit.
Figure 2:
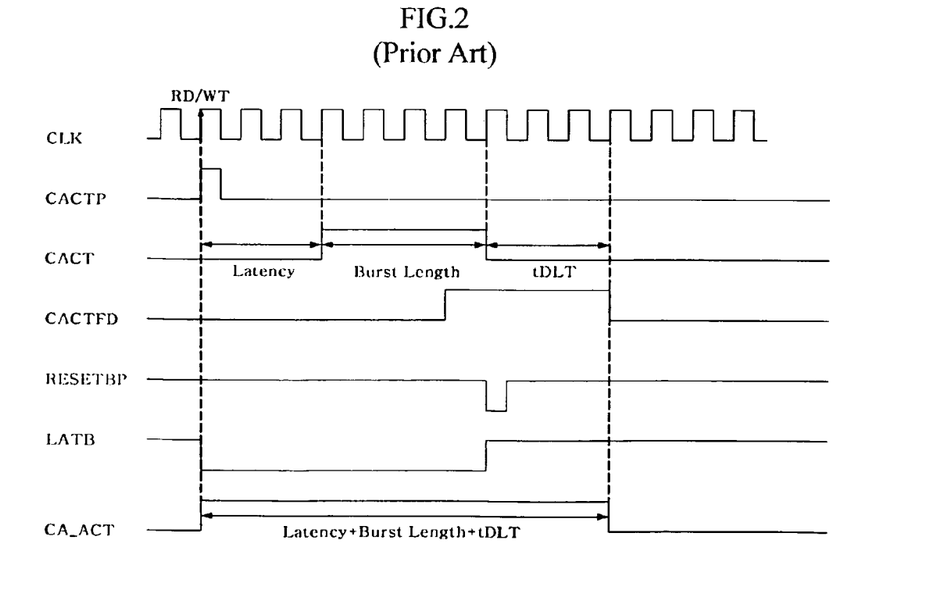
FIGS. 2 and 3 are signal waveform diagrams illustrating the operation of the conventional internal voltage generation control circuit.
Figure 3:
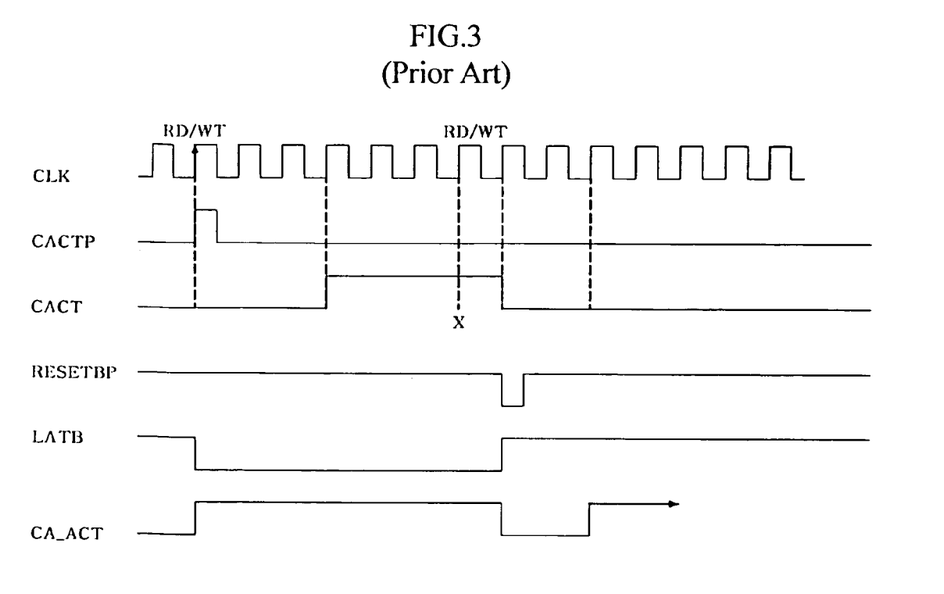

FIG. 1 illustrates the configuration of a conventional internal voltage generation control circuit, and FIGS. 2 and 3 are signal waveform diagrams illustrating the operation of the conventional internal voltage generation control circuit. The above problem of the conventional semiconductor device will now be described in detail with reference to FIGS. 1 to 3.

The conventional internal voltage generation control circuit shown in FIG. 1 operates in the following manner. As shown in FIG. 2, if a read or write command RD/WT is input synchronously with a rising edge of a clock CLK, a column active pulse signal CACTP is generated and input to a PMOS P12 and an NMOS N11 in the internal voltage generation control circuit. In addition, a column active signal CACT is generated and input to a delay unit 102 and a pulse generator 101.

The column active pulse signal CACTP is a signal that is generated when a read/write command RD/WT is input. The column active pulse signal CACTP is enabled synchronously with the input of the read/write command RD/WT, and serves as a source signal in generating a control signal CA_ACT for use in generating an internal voltage required for a read/write operation. The column active signal CACT is a signal which contains burst length information and allows a column operation such as a read or write operation of a bank of interest to be performed after a latency has elapsed from the moment when a read or write command RD/WT is input. The term "latency" refers to a time required to initiate a data read or write operation from the moment when a corresponding read or write command is input.

If the column active pulse CACTP is enabled (i.e., shifts from a low level to a high level) as a read/write command is input as shown in FIG. 2, the NMOS N11 is turned on so that a node LATB is pulled down to a low level. Then, a latch 103 latches the low level information during a predetermined time and outputs a high level signal. Accordingly, the internal voltage generation control signal CA_ACT is enabled (i.e., shifts to a high level), thereby controlling an internal voltage generation unit (not shown) to generate an internal voltage.

The pulse generator 101 receives a column active signal CACT, and generates and provides a signal RESETBP to the PMOS P11. The signal RESETBP is a signal that is enabled (i.e., shifts to a low level) at the moment when the column active signal CACT is disabled (i.e., shifts from a high level to a low level), i.e., when clock periods, which correspond to the sum of the latency and the burst length, expire. Until the clock periods expire, the PMOS P11 receives a high level signal and remains off, so that the output of the latch 103 maintains the previous state. The delay unit 102 delays the column active signal CACT by a predetermined delay time tDLT and outputs the delayed signal CACTFD as shown in FIG. 2.

If the column active signal CACT shifts from a high level to a low level as the clock periods, corresponding to the sum of the latency and the burst length, elapse after the read/write command is input, the PMOS P11 is turned on so that the node LATB is pulled up to a high level. Then, the latch 103 latches the high level information and outputs a low level signal through its output terminal. The low level signal is input to an input terminal A of a NOR gate NR11. At this time, the signal CACTFD output from the delay unit 102 remains high as shown in FIG. 2, and therefore the output signal of the NOR gate NR11 is low, so that the internal voltage generation control signal CA_ACT remains enabled (i.e., remains high).

If the signal CACTFD shifts to a low level as a delay time tDLT elapses from that moment when the clock periods expire, all input signals of the NOR gate NR11 are low, so that the internal voltage generation control signal CA_ACT is disabled (i.e., shifts to a low level).

As described above, the conventional internal voltage generation control circuit enables the internal voltage generation control signal CA_ACT if a read/write command is input, and then disables the signal CA_ACT after a time interval, which corresponds to the sum of the latency, the burst length, and the delay time (tDLT), elapses, thereby allowing an active-operation internal voltage to be supplied during the time interval (i.e., latency+burst length+tDLT).

The delay time tDLT determines how long the internal voltage generation control signal CA_ACT remains enabled after the column active signal CACT drops to a low level. As shown in FIG. 3, if another read/write command RD/WT is input at a time X before the column active signal CACT drops to a low level in the case where the delay time tDLT is not employed, the internal voltage generation control signal CA_ACT shifts to a high level immediately after shifting from a high level to a low level, which causes internal voltage instability. The delay time tDLT is used to prevent this phenomenon.

However, since the delay time tDLT is fixed to about 30 ns, the conventional internal voltage generation control circuit has a problem in that unnecessary current consumption is caused as the clock frequency increases. That is, if the clock frequency is increased, a time interval corresponding to the latency and the burst length is decreased even if the number of clock periods corresponding to the sum of the latency and the burst length is constant. Accordingly, a delay time, required to prevent the internal voltage generation control signal CA_ACT from alternating between the high and low levels as described above, is also decreased. However, in the conventional internal voltage generation control circuit, the internal voltage generation control signal CA_ACT remains enabled for an excessively long time since the delay time tDLT is fixed regardless of the clock frequency, thereby causing unnecessarily large current consumption.

SUMMARY OF THE INVENTION

Therefore, the present invention has been made in view of the above problems, and it is an object of the present invention to provide an internal voltage generation control circuit and an internal voltage generation circuit using the same, wherein the internal voltage generation control circuit generates an internal voltage generation control signal that is enabled in synchronization with the input of a read or write command and is then disabled after a time interval corresponding to clock periods including at least a latency and a burst length elapses, which allows an active-operation internal voltage required for a read/write operation to be supplied solely during a suitable time based on the clock frequency, thereby decreasing unnecessary current consumption.

In accordance with one aspect of the present invention, the above and other objects can be accomplished by the provision of an internal voltage generation control circuit comprising a first latch for receiving, as an input signal, a column active pulse signal that is generated after a read or write command is input, and latching state information of the column active pulse signal, which is received when a clock signal is enabled, during a predetermined time, and then outputting the latched state information; second to n-th latches, wherein a k-th latch receives, as an input signal, an output signal of a k−1-th latch, and latches state information of the output signal of the k−1-th latch, which is received when the clock signal is enabled, during a predetermined time, and then outputs the latched state information, where k and n are natural numbers satisfying $2 \leq k \leq n$; and a logic unit for performing a logical operation between the column active pulse signal and output signals of the first to n-th latches and outputting an internal voltage generation control signal.

Preferably, each of the first to n-th latches latches state information of an input signal received at a falling edge of the clock signal and outputs the latched state information in synchronization with a next rising edge of the clock signal.

Preferably, each of the first to n-th latches latches state information of an input signal received at a rising edge of the clock signal and outputs the latched state information in synchronization with a next falling edge of the clock signal.

Preferably, each of the first to n-th latches includes a flip-flop.

Preferably, each of the first to n-th latches includes a shift register.

Preferably, the natural number "n" is greater than or equal to the number of clock periods including at least a latency and a burst length.

Preferably, the logic unit performs an OR operation between the column active pulse signal and output signals of the first to n-th latches and outputs a signal indicating a result of the OR operation.

In accordance with another aspect of the present invention, there is provided an internal voltage generation circuit comprising a row active control unit for outputting a first internal voltage generation control signal that is enabled after an active command is input and is then disabled after at least a Row Address Strobe (RAS) activation time elapses; a column active control unit for outputting a second internal voltage generation control signal that remains enabled during a time interval corresponding to clock periods including at least a latency and a burst length after being enabled in synchronization with input of a read or write command; a row precharge control unit for outputting a third internal voltage control signal that is enabled after a row precharge command is input and is then disabled after a predetermined delay time elapses; a first logic unit for performing a logical operation between the first to third internal voltage generation control signals and outputting a signal indicating a result of the logical operation; and an internal voltage generator for generating an internal voltage in response to the signal output from the first logic unit.

Preferably, the column active control unit comprises a first latch for receiving, as an input signal, a column active pulse signal that is generated after the read or write command is input, and latching state information of the column active pulse signal, which is received when a clock signal is enabled, during a predetermined time, and then outputting the latched state information; second to n-th latches, wherein a k-th latch receives, as an input signal, an output signal of a k−1-th latch, and latches state information of the output signal of the k−1-th latch, which is received when the clock signal is enabled, during a predetermined time, and then outputs the latched state information, where k and n are natural numbers satisfying $2 \leq k \leq n$; and a second logic unit for performing a logical operation between the column active pulse signal and output signals of the first to n-th latches and outputting the second internal voltage generation control signal.

Preferably, each of the first to n-th latches latches state information of an input signal received at a falling edge of the clock signal and outputs the latched state information in synchronization with a next rising edge of the clock signal.

Preferably, each of the first to n-th latches latches state information of an input signal received at a rising edge of the clock signal and outputs the latched state information in synchronization with a next falling edge of the clock signal.

Preferably, each of the first to n-th latches includes a flip-flop.

Preferably, each of the first to n-th latches includes a shift register.

Preferably, the natural number "n" is greater than or equal to the number of clock periods including at least a latency and a burst length.

Preferably, the second logic unit performs an OR operation between the column active pulse signal and output signals of the first to n-th latches and outputs a signal indicating a result of the OR operation.

Preferably, the first logic unit performs an OR operation between the first to third internal voltage generation control signals and outputs a signal indicating a result of the logical operation.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Preferred embodiments of the present invention will now be described in detail with reference to the accompanying drawings. The preferred embodiments should be regarded as illustrative, without limiting the scope of the present invention.

The present invention provides a circuit for generating an internal voltage of a semiconductor device, and particularly provides a circuit for generating an internal voltage for an active operation and a circuit for controlling the generation of the internal voltage.

Figure 4:
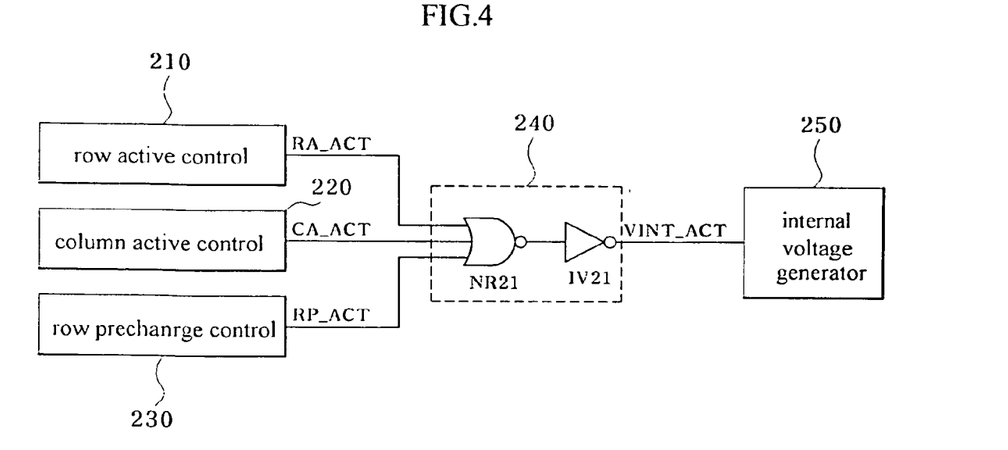
FIG. 4 illustrates the configuration of an internal voltage generation circuit according to an embodiment of the present invention.
Figure 5:
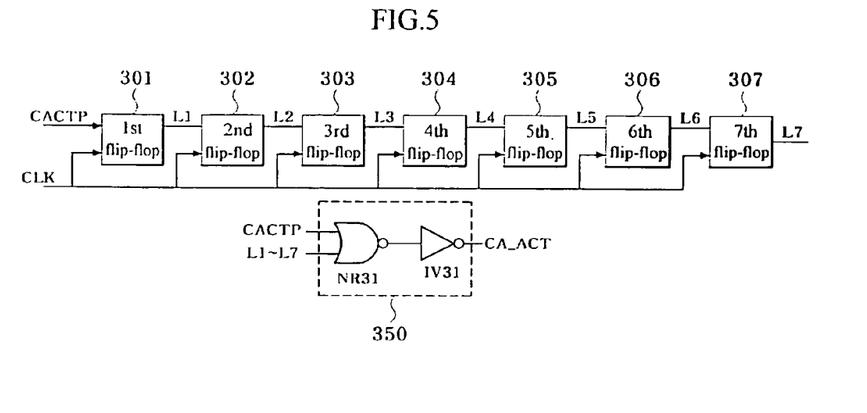
FIG. 5 illustrates the configuration of an internal voltage generation control circuit according to an embodiment of the present invention.

FIG. 4 shows the configuration of an internal voltage generation circuit according to an embodiment of the present invention. FIG. 5 shows the configuration of an internal voltage generation control circuit according to an embodiment of the present invention, particularly the configuration of a column active control circuit, which is a circuit for controlling the generation of an internal voltage associated with a column operation (an input/output operation).

As shown in FIG. 4, the internal voltage generation circuit according to this embodiment comprises a row active control unit 210, a column active control unit 220, a row precharge control unit 230, a logic unit 240, and an internal voltage generator 250. The row active control unit 210 outputs a first internal voltage generation control signal RA_ACT. The first internal voltage generation control signal RA_ACT is enabled after an active command is input, and is then disabled after at least a Row Address Strobe (RAS) activation time elapses. The column active control unit 220 outputs a second internal voltage generation control signal CA_ACT. The second internal voltage generation control signal CA_ACT remains enabled during a time interval, which corresponds to clock periods including at least a latency and a burst length, after being enabled in synchronization with input of a read or write command. The row precharge control unit 230 outputs a third internal voltage generation control signal RP_ACT. The third internal voltage generation control signal RP_ACT is enabled after a row precharge command is input, and is then disabled after at least a predetermined delay time elapses. The logic unit 240 performs an OR operation between the first to third internal voltage generation control signals RA_ACT, CA_ACT and RP_ACT and outputs a signal VINT_ACT. The internal voltage generator 250 generates an internal voltage in response to the output signal VINT_ACT of the logic unit 240.

As shown in FIG. 5, the column active control unit 220 comprises first to seventh flip-flops 301 to 307 and a logic unit 350. The first flip-flop 301 receives, as an input signal, a column active pulse signal CACTP that is generated after a read or write command RD/WT is input. The first flip-flop 301 latches state information of the column active pulse signal CACTP, which is received when a clock signal CLK is enabled, during a predetermined time, and then outputs the latched state information. A k-th flip-flop from among the second to seventh flip-flops 302 to 307 receives, as an input signal, an output signal of a k–1-th flip-flop. The k-th flip-flop latches state information of the output signal of the k–1-th flip-flop, which is received when the clock signal CLK is enabled, during a predetermined time, and then outputs the latched state information. The logic unit 350 performs an OR operation between the column active pulse signal CACTP and output signals L1 to L7 of the first to seventh flip-flops 301 to 307, and outputs a second internal voltage generation control signal CA_ACT.

Each of the first to seventh flip-flops 301 to 307 is characterized in that it latches state information of an input signal received at a falling (or rising) edge of the clock signal CLK, and outputs the latched state information in synchronization with a next rising (or falling) edge of the clock signal CLK.

Figure 6:
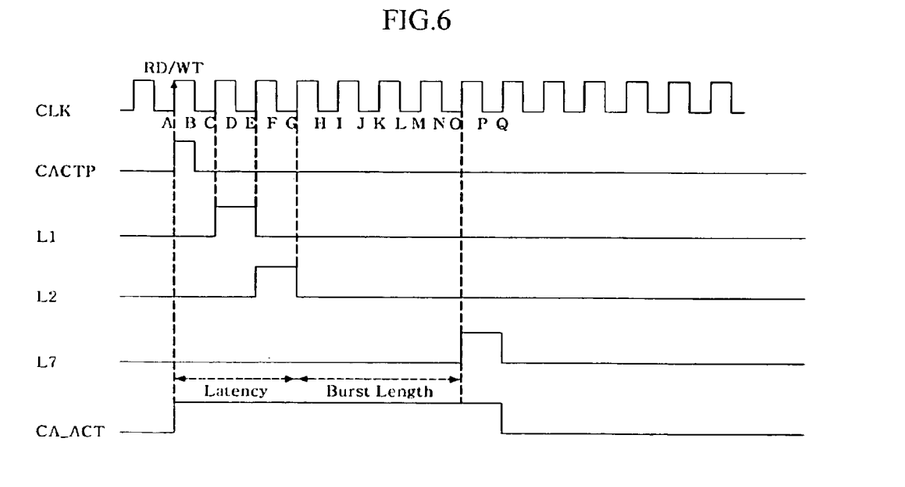
FIGS. 6 and 7 are signal waveform diagrams illustrating the operation of the internal voltage generation control circuit of FIG. 5.

The operation of the internal voltage generation circuit according to this embodiment of the present invention will now be described with reference to FIGS. 4 to 6.

As shown in FIG. 4, the logic unit 240, which includes a NOR gate NR21 and an inverter IV21, performs an OR operation between the first internal voltage generation control signal RA_ACT output from the row active control unit 210, the second internal voltage generation control signal CA_ACT output from the column active control unit 220, and the third internal voltage generation control signal RP_ACT output from the row precharge control unit 230, and outputs a control signal VINT_ACT corresponding to the result of the OR operation. The internal voltage generator 250 receives the control signal VINT_ACT, and generates an internal voltage, particularly an internal voltage for an active operation. A more-detailed description will now be given of the operation of the internal voltage generation circuit.

As described above, the row active control unit 210 outputs the first internal voltage generation control signal RA_ACT, which is enabled after an active command is input and is then disabled after at least an RAS activation time elapses. Specifically, if the active command is input, the row active control unit 210 activates a corresponding word line so as to again store data of the cell. To accomplish this, if the active command is input, the row active control unit 210 outputs the first internal voltage generation control signal RA_ACT, which is enabled until at least the RAS activation time tRAS elapses, in response to predetermined control signals (not shown), so that an internal voltage is supplied during the time when the control signal is enabled. The RAS activation time tRAS is a time required to again store the cell data completely after the corresponding word line is activated.

The column active control unit 220 outputs the second internal voltage generation control signal CA_ACT, which remains enabled during a time interval, which corresponds to clock periods including at least a latency and a burst length, after being enabled in synchronization with input of a read or write command. This operation will be described later in more detail.

The row precharge control unit 230 outputs the third internal voltage generation control signal RP_ACT, which is enabled after a row precharge command is input and is then disabled after a predetermined delay time elapses. Specifically, if the row precharge command is input, the row precharge control unit 230 outputs the third internal voltage generation control signal RP_ACT that is enabled during a delay time that includes at least a time interval from when a row precharge operation is initiated to when the row precharge operation is completed, in response to predetermined control signals (not shown), thereby allowing the internal voltage to be supplied during the delay time. The delay time is needed to secure the time required to perform the precharge operation and, if needed, also to secure the time required to operate the internal voltage generation circuit in order to stabilize the internal voltage after the precharge operation is completed.

The logic unit 240 performs an OR operation between the first internal voltage generation control signal RA_ACT output from the row active control unit 210, the second internal voltage generation control signal CA_ACT output from the column active control unit 220, and the third internal voltage generation control signal RP_ACT output from the row precharge control unit 230, and outputs a control signal VINT_ACT corresponding to the result of the OR operation.

Finally, the internal voltage generator 250 generates and supplies an internal voltage (particularly, an internal voltage for an active operation) in response to the control signal VINT_ACT.

The operation of the column active control unit 220, which is a circuit for controlling the generation of an internal voltage associated with a column operation (an input/output operation), will now be described in detail with reference to FIGS. 5 and 6. The internal voltage generation control circuit shown in FIG. 5 is an example in which the number of flip-flops is 7. The number of flip-flops may vary depending on the system environment.

The first flip-flop 301 receives, as an input signal, a column active pulse signal CACTP. The first flip-flop 301 latches state information of the column active pulse signal CACTP, which is received when a clock signal CLK is enabled, during a predetermined time, and then outputs a signal L1 as the latched state information. Specifically, the first flip-flop 301 latches state information of the column active pulse signal CACTP, which is an input signal received at a falling edge of the clock signal CLK, and then outputs the latched state information in synchronization with a next rising edge of the clock signal CLK. For example, as shown in FIG. 6, if a read/write command RD/WT is received at a rising edge A of the clock signal CLK, the first flip-flop 301 latches high level information, which is state information of the column active pulse signal CACTP received at a falling edge B of the clock signal CLK, and then outputs a signal L1 indicating the high level information in synchronization with a next rising edge C of the clock signal CLK. Then, the first flip-flop 301 latches low level information, which is state information of the column active pulse signal CACTP received at a next falling edge D of the clock signal CLK, and then outputs a signal L1 indicating the low level information in synchronization with a next rising edge E of the clock signal CLK. Accordingly, the output signal L1 of the first flip-flop 301 is a pulse signal as shown in FIG. 6.

The column active pulse signal CACTP is a signal that is generated when a read/write command RD/WT is input. The column active pulse signal CACTP is enabled synchronously with the input of the read/write command RD/WT, and serves as a source signal in generating a control signal CA_ACT for use in generating an internal voltage required for a read/write operation.

The second flip-flop 302 receives, as an input signal, the signal L1. The second flip-flop 302 latches state information of the signal L1, which is received when the clock signal CLK is enabled, during a predetermined time, and then outputs a signal L2 as the latched state information. Specifically, in the same manner as the first flip-flop 301, the second flip-flop 302 latches state information of the signal L1, which is an input signal received at a falling edge of the clock signal CLK, and then outputs the latched state information in synchronization with a next rising edge of the clock signal CLK. For example, as shown in FIG. 6, if the signal L1 is received, the second flip-flop 302 latches high level information, which is state information of the signal L1 received at a falling edge D of the clock signal CLK, and then outputs a signal L2 indicating the high level information in synchronization with a next rising edge E of the clock signal CLK. Then, the second flip-flop 302 latches low level information, which is state information of the signal L1 received at a next falling edge F of the clock signal CLK, and then outputs a signal L2 indicating the low level information in synchronization with a next rising edge G of the clock signal CLK. Accordingly, the output signal L2 of the second flip-flop 302 is a pulse signal as shown in FIG. 6.

In the same manner as described above, an output signal L3 of the third flip-flop 303 rises to a high level in synchronization with the rising edge G of the clock signal CLK and then drops to a low level in synchronization with a rising edge I of the clock signal CLK; an output signal L4 of the fourth flip-flop 304 rises to a high level in synchronization with the rising edge I of the clock signal CLK and then drops to a low level in synchronization with a rising edge K of the clock signal CLK; an output signal L5 of the fifth flip-flop 305 rises to a high level in synchronization with the rising edge K of the clock signal CLK and then drops to a low level in synchronization with the rising edge M of the clock signal CLK; and an output signal L6 of the sixth flip-flop 306 rises to a high level in synchronization with a rising edge M of the clock signal CLK and then drops to a low level in synchronization with a rising edge O of the clock signal CLK. Finally, an output signal L7 of the seventh flip-flop 307 rises to a high level in synchronization with the rising edge O of the clock signal CLK and then drops to a low level in synchronization with a rising edge Q of the clock signal CLK.

The column active pulse signal CACTP and the seven signals L1 to L7 are input to the logic unit 350 which performs a logical OR operation. As the column active pulse signal CACTP and the signals L1 to L7 are ORed together through the NOR gate NR31 and the inverter 31 included in the logic unit 350, the second internal voltage generation control signal CA_ACT output from the internal voltage generation control unit 220 is a signal that is enabled (i.e., shifts to a high level) at a rising edge of the column active pulse signal CACTP and is then disabled (i.e., shifts to a low level) at a falling edge of the signal L7. Accordingly, an internal voltage associated with a read/write operation, which is generated by the internal voltage generator 250, is supplied during the time when the second internal voltage generation control signal CA_ACT is enabled.

The number of used flip-flops (i.e., 7 in this example) is determined based on the burst length and the latency of the system. That is, the internal voltage generation control circuit and the internal voltage generation circuit according to this embodiment are illustrated as being applied to a semiconductor device having a latency of 3 clock periods and a burst length of 4 clock periods. To complete a data read/write operation, it is necessary to supply the internal voltage during a time interval including at least the latency and the burst length. Therefore, in this embodiment, the number of flip-flops is determined to be 7, so that the second internal voltage generation control signal CA_ACT is enabled during at least 7 (=3+4) clock periods after the column active pulse signal CACTP is enabled and the second internal voltage generation control signal CA_ACT is then disabled at the clock edge Q. More than 7 flip-flops may also be provided to stabilize data input/output operations according to system conditions.

The column active control unit 220, which is an internal voltage generation control circuit according to this embodiment of the present invention, generates an internal voltage generation control signal that is enabled in synchronization with the input of a read or write command and is then disabled after a time interval corresponding to clock periods including at least the latency and the burst length elapses. This allows an active-operation internal voltage required for a read/write operation to be supplied solely during a suitable time based on the clock frequency, thereby decreasing unnecessary current consumption. In this embodiment, even if the clock frequency is increased, output signals of the flip-flops and a second internal voltage generation control signal CA_ACT corresponding to the output signals are also adjusted according to the increase of the clock frequency. This decreases unnecessary current consumption that is caused by supplying an active-operation internal voltage required for a read/write operation during an excessive time that is more than a suitable time required to perform the read/write operation.

Figure 7:
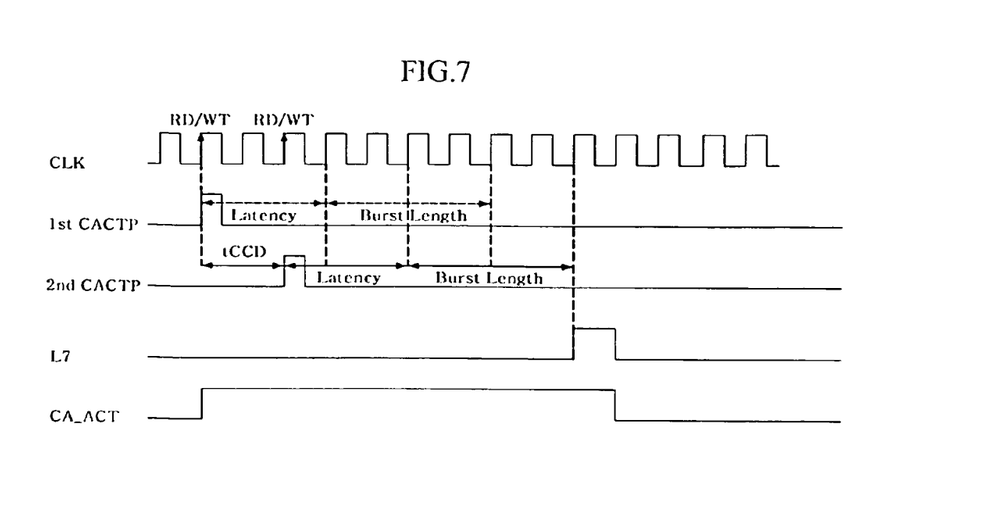

FIG. 7 is a signal waveform diagram illustrating the operation of the internal voltage generation circuit according to the present invention in the case where a second read/write command RD/WT is input after a first read/write command RD/WT is input and a delay time tCCD (or a CAS to CAS delay) elapses. The time tCCD is a delay time between column operations that is the minimum time that must be secured to perform a column operation after a previous column operation is performed. As shown in FIG. 7, if the second read/write command RD/WT is input before an input/output operation according to the first read/write command RD/WT is completed after the first column active pulse signal (1st CACTP) is enabled as the first read/write command RD/WT is input, the column active control unit 220 shown in FIG. 5 generates a second internal voltage generation control signal CA_ACT that is enabled in response to a second column active pulse signal (2nd CACTP), which is enabled as the second read/write command RD/WT is input, during at least clock periods corresponding to the sum of the latency and the burst length from the moment when the second column active pulse signal (2nd CACTP) is enabled. According to this embodiment, the second internal voltage generation control signal CA_ACT remains enabled even if another read/write command RD/WT is input while the read/write operation is being performed. This allows the internal voltage to be stably and continuously supplied without unnecessarily alternating between high and low levels (or between on and off).

Figure 8:
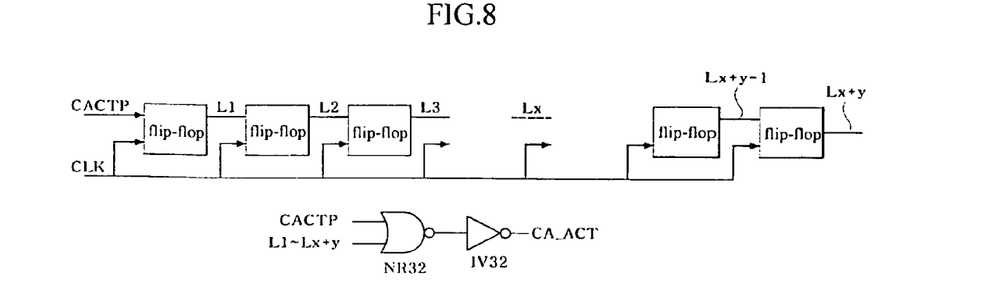
FIG. 8 illustrates the configuration of an internal voltage generation control circuit according to another embodiment of the present invention.

Although the above embodiment has been described for the system whose latency is 3 clock periods and whose burst length is 4 clock periods, the number of clock periods may be set differently depending system conditions. That is, for a system whose latency is x clock periods and whose burst length is y clock periods, the number of flip-flops may be set to (x+y) as shown in FIG. 8 and more than (x+y) flip-flops may also be provided to stabilize data input/output operations according to system conditions.

In addition, although the above embodiment has been described with reference to flip-flops, each of which is an element that latches state information of an input signal received at a falling edge of the clock signal CLK and then outputs the latched state information in synchronization with a next rising edge of the clock signal CLK, each flip-flop may be an element that latches state information of an input signal received at a rising edge of the clock signal CLK and then outputs the latched state information in synchronization with a next falling edge of the clock signal CLK.

Further, a shift register, which shifts and outputs each input signal by one clock period, may be used instead of each flip-flop used in the above embodiment.

As is apparent from the above description, an internal voltage generation control circuit and an internal voltage generation circuit using the circuit according to the present invention have the following advantages. The internal voltage generation control circuit generates an internal voltage generation control signal that is enabled in synchronization with input of a read or write command and is then disabled after a time interval, which corresponds to clock periods including at least a latency and a burst length, elapses, so that an active-operation internal voltage required for a read/write operation is supplied solely during a suitable time based on a clock frequency. This decreases unnecessary current consumption and also prevents the active-operation internal voltage from unnecessarily alternating between on and off when irregular read/write commands are sequentially input, thereby achieving stable supply of the internal voltage.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An internal voltage generation control circuit comprising:
 a first latch for receiving, as an input signal, a column active pulse signal that is generated after a read or write command is input, and latching state information of the column active pulse signal, which is received when a clock signal is enabled, during a predetermined time, and then outputting the latched state information;
 second to n-th latches, wherein a k-th latch receives, as an input signal, an output signal of a k−1-th latch, and latches state information of the output signal of the k−1-th latch, which is received when the clock signal is enabled, during a predetermined time, and then outputs the latched state information, where k and n are natural numbers satisfying $2 \leq k \leq n$; and
 a logic unit for performing a logical operation between the column active pulse signal and output signals of the first to n-th latches and outputting an internal voltage generation control signal.

2. The internal voltage generation control circuit according to claim 1, wherein each of the first to n-th latches latches state information of an input signal received at a falling edge of the clock signal and outputs the latched state information in synchronization with a next rising edge of the clock signal.

3. The internal voltage generation control circuit according to claim 1, wherein each of the first to n-th latches latches state information of an input signal received at a rising edge of the clock signal and outputs the latched state information in synchronization with a next falling edge of the clock signal.

4. The internal voltage generation control circuit according to claim 2 or 3, wherein each of the first to n-th latches includes a flip-flop.

5. The internal voltage generation control circuit according to claim 2 or 3, wherein each of the first to n-th latches includes a shift register.

6. The internal voltage generation control circuit according to claim 1, wherein the natural number "n" is greater than or equal to the number of clock periods including at least a latency and a burst length.

7. The internal voltage generation control circuit according to claim 1, wherein the logic unit performs an OR operation between the column active pulse signal and output signals of the first to n-th latches and outputs a signal indicating a result of the OR operation.

8. An internal voltage generation circuit comprising:
 a row active control unit for outputting a first internal voltage generation control signal that is enabled after an active command is input and is then disabled after at least a Row Address Strobe (RAS) activation time elapses;
 a column active control unit for outputting a second internal voltage generation control signal that remains enabled during a time interval corresponding to clock periods including at least a latency and a burst length after being enabled in synchronization with input of a read or write command;
 a row precharge control unit for outputting a third internal voltage control signal that is enabled after a row precharge command is input and is then disabled after a predetermined delay time elapses;
 a first logic unit for performing a logical operation between the first to third internal voltage generation control signals and outputting a signal indicating a result of the logical operation; and
 an internal voltage generator for generating an internal voltage in response to the signal output from the first logic unit.

9. The internal voltage generation circuit according to claim 8, wherein the column active control unit comprises:
 a first latch for receiving, as an input signal, a column active pulse signal that is generated after the read or write command is input, and latching state information of the column active pulse signal, which is received when a clock signal is enabled, during a predetermined time, and then outputting the latched state information;
 second to n-th latches, wherein a k-th latch receives, as an input signal, an output signal of a k−1-th latch, and latches state information of the output signal of the k−1-th latch, which is received when the clock signal is enabled, during a predetermined time, and then outputs the latched state information, where k and n are natural numbers satisfying 2≦k≦n; and
 a second logic unit for performing a logical operation between the column active pulse signal and output signals of the first to n-th latches and outputting the second internal voltage generation control signal.

10. The internal voltage generation circuit according to claim 9, wherein each of the first to n-th latches latches state information of an input signal received at a falling edge of the clock signal and outputs the latched state information in synchronization with a next rising edge of the clock signal.

11. The internal voltage generation circuit according to claim 9, wherein each of the first to n-th latches latches state information of an input signal received at a rising edge of the clock signal and outputs the latched state information in synchronization with a next falling edge of the clock signal.

12. The internal voltage generation circuit according to claim 10, wherein each of the first to n-th latches includes a flip-flop.

13. The internal voltage generation circuit according to claim 10, wherein each of the first to n-th latches includes a shift register.

14. The internal voltage generation circuit according to claim 9, wherein the natural number "n" is greater than or equal to the number of clock periods including at least a latency and a burst length.

15. The internal voltage generation circuit according to claim 9, wherein the second logic unit performs an OR operation between the column active pulse signal and output signals of the first to n-th latches and outputs a signal indicating a result of the OR operation.

16. The internal voltage generation circuit according to claim 8, wherein the first logic unit performs an OR operation between the first to third internal voltage generation control signals and outputs a signal indicating a result of the logical operation.

* * * * *